(12) United States Patent
Alzaher (10) Patent No.: US 10,541,675 B1
(45) Date of Patent: Jan. 21, 2020

(54) MULTI-GAIN TRANSCONDUCTANCE AMPLIFIER

(71) Applicant: King Fahd University of Petroleum and Minerals, Dhahran (SA)

(72) Inventor: Hussain Alzaher, Dhahran (SA)

(73) Assignee: King Fahd University of Petroleum and Minerals, Dhahram (SA)

( * ) Notice: Subject to any disclaimer, the term of this patent is extended or adjusted under 35 U.S.C. 154(b) by 0 days.

(21) Appl. No.: 16/191,878

(22) Filed: Nov. 15, 2018

(51) Int. Cl.
*H03F 3/45* (2006.01)
*H03H 11/04* (2006.01)

(52) U.S. Cl.
CPC ..... *H03H 11/0466* (2013.01); *H03F 3/45192* (2013.01); *H03F 2200/267* (2013.01); *H03F 2203/45182* (2013.01); *H03H 2210/021* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,150,885 | A * | 11/2000 | Ashby | H03F 3/45304 330/257 |
| 6,411,163 | B1 * | 6/2002 | Enriquez | H03F 3/3066 330/257 |
| 7,496,865 | B2 | 2/2009 | Chang et al. | |
| 8,264,289 | B2 | 9/2012 | Chang et al. | |
| 8,723,599 | B1 * | 5/2014 | Leuciuc | H03F 3/45174 327/359 |
| 8,872,580 | B2 | 10/2014 | Alzaher | |
| 9,019,014 | B2 * | 4/2015 | Alzaher | H03F 3/45183 330/254 |
| 2002/0097081 | A1 * | 7/2002 | Razavi | H03D 3/008 327/307 |

(Continued)

FOREIGN PATENT DOCUMENTS

CN 101626221 B 3/2012

OTHER PUBLICATIONS

Alzaher ; A CMOS multi-gain transconductance amplifier and its applications ; Analog Integrated Circuits and Signal Processing, An International Journal, vol. 95, Issue 2 ; pp. 357-364 ; 10 Pages.

(Continued)

*Primary Examiner* — Adam D Houston
(74) *Attorney, Agent, or Firm* — Oblon, McClelland, Maier & Neustadt, L.L.P.

(57) ABSTRACT

A multiple-gain transconductance amplifier circuit is presented. It is developed by utilizing programmable gain source-coupling differential pair output stage forming multiple-gain transconductance amplifier outputs. A reconfigurable $n^{th}$-order filter based on a multi-gain transconductance amplifier where the multi-gain transconductance amplifier includes a linear voltage-to-current converter and a programmable current-folding output stage was implemented. The filter achieves independent programmability while still using a single active device per pole. Further, the proposed multiple-gain transconductance amplifier can be employed to design poly phase filters and transconductance amplifier cell for an amplifier-based low-dropout regulator.

7 Claims, 11 Drawing Sheets

(56) References Cited

U.S. PATENT DOCUMENTS

| | | | | |
|---|---|---|---|---|
| 2002/0171773 | A1* | 11/2002 | Gower | H03F 3/005 348/691 |
| 2003/0090323 | A1* | 5/2003 | Costa | H03F 3/45085 330/254 |
| 2003/0112069 | A1* | 6/2003 | Kim | H03F 3/3008 330/252 |
| 2004/0027200 | A1* | 2/2004 | Ashby | H03F 3/45098 330/254 |
| 2006/0028276 | A1* | 2/2006 | Youngblood | H03F 3/4508 330/264 |
| 2006/0055383 | A1* | 3/2006 | Eberlein | G05F 1/575 323/280 |
| 2006/0066400 | A1* | 3/2006 | Kang | H03F 3/3022 330/255 |
| 2007/0126501 | A1* | 6/2007 | Kim | H03F 1/08 330/86 |
| 2007/0229161 | A1* | 10/2007 | Killat | H03F 1/32 330/260 |
| 2008/0048780 | A1* | 2/2008 | Kim | H03F 1/3211 330/261 |
| 2008/0068107 | A1* | 3/2008 | Luich | H03B 5/368 331/158 |
| 2009/0257287 | A1* | 10/2009 | Searles | G06F 13/4243 365/189.09 |
| 2010/0277215 | A1* | 11/2010 | Tam | H03F 3/211 327/333 |
| 2011/0035427 | A1* | 2/2011 | Joseph | H03M 3/462 708/313 |
| 2014/0015602 | A1 | 1/2014 | Alzaher | |
| 2014/0167857 | A1* | 6/2014 | Jenkins | H03F 1/0277 330/295 |
| 2015/0028952 | A1* | 1/2015 | Alzaher | H03F 3/45183 330/254 |
| 2015/0188495 | A1* | 7/2015 | Story | H03F 1/0211 341/155 |
| 2017/0054417 | A1* | 2/2017 | Pulijala | H03F 1/3211 |
| 2019/0020323 | A1* | 1/2019 | Schulz | H03F 3/45273 |
| 2019/0080660 | A1* | 3/2019 | Kim | G09G 3/3685 |
| 2019/0245524 | A1* | 8/2019 | Kim | H03K 19/018528 |
| 2019/0302825 | A1* | 10/2019 | Hallikainen | G05F 3/30 |
| 2019/0305420 | A1* | 10/2019 | Morishita | H03K 5/01 |
| 2019/0348958 | A1* | 11/2019 | Bensaleh | H03F 3/45264 |

OTHER PUBLICATIONS

Haung, et al.; Linear Tunable Comfet Transconductor; Electronic Letters vol. 29, No. 5; Mar. 4, 1993; 3 pages.

Alzaher, et al; Programmable multi-gain current amplifier; IET Circuits, Devices & Systems; Jul. 26, 2012; 8 pages.

\* cited by examiner

MULTI-GAIN TRANSCONDUCTANCE AMPLIFIER

BACKGROUND

Technical Field

The exemplary embodiments described herein are related to the field of amplifiers and reconfigurable high order filters.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Transconductance amplifiers based circuits are attractive for integrated circuit (IC) applications because they are inherently programmable. The circuits can be classified based on the transconductance amplifiers used. There are two types of transconductance amplifiers namely single output or multi-output ones. Multi-outputs transconductance amplifiers can reduce a number of active devices in an IC. However, reduction of the number of the active devices can reduce programmability of the IC.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

In one embodiment, there is provided a multiple-gain independently programmable transconductance amplifier including a voltage-to-current conversion circuit configured to receive a differential input voltage signal at a first input and provide at an output node a first single-ended current signal that is linearly proportional to the differential input voltage signal. The multiple-gain independently programmable transconductance amplifier also includes a multiple-gain current-folding output stage comprising a plurality of differential pairs. Each differential pair includes a first transistor and a second transistor, a first gate of the first transistor being directly connected to the output node, and a second gate of the second transistor being directly connected to a bias voltage source. The first transistor and the second transistor of each differential pair are source coupled and in series with one adjustable current mirror supply. At least one of the plurality of differential pairs is configured to program a different gain of the output stage by varying a bias current of a corresponding adjustable current mirror supply.

In an embodiment, the voltage-to-current conversion circuit further comprises a differential input voltage source and a first differential pair. The first differential pair further includes a third transistor and a fourth transistor, where gates of the third transistor and the fourth transistor are respectively connected to the differential input voltage source, drains of the third transistor and the fourth transistor are connected to a current mirror supply, and respective sources of the third transistor and the fourth transistor are connected to a diode-connected load. Further, one of the drains outputs the first single-ended current signal. The voltage-to-current conversion circuit also includes a second differential pair that includes a fifth transistor and a sixth transistor, where sources of the second differential pair are connected to and biased by a variable voltage source, gates of the second differential pair are connected to respective sources of the first differential pair, and respective drains of the second differential pair are cross-coupled to the drains of the first differential pair.

In one embodiment, programmable currents of the output stages of the multiple-gain independently programmable transconductance amplifier are set based on a first bias current of a first differential pair of the multiple-gain current-folding output stage, a second bias current of a second differential pair of the multiple-gain current-folding output stage, a transconductance of the input stage, a positive input voltage, and a negative input voltage.

In an embodiment, a reconfigurable high-order integrated circuit filter includes a ground node, a plurality of multi-gain transconductance amplifiers arranged in cascade, and a plurality of capacitors, where each capacitor is connected between the ground node and a second of the at least three outputs of the intermediate stage multi-gain transconductance amplifier. Each multiple-gain transconductance amplifier further includes a voltage-to-current conversion circuit configured to receive a differential input voltage signal at a first input and provide at an output node a first single-ended current signal that is linearly proportional to the differential input voltage signal. Each multiple-gain transconductance amplifier also includes a multiple-gain current-folding output stage comprising a plurality of differential pairs. Each differential pair includes a first transistor and a second transistor, a first gate of the first transistor being directly connected to the output node, and a second gate of the second transistor being directly connected to a bias voltage source. The first transistor and the second transistor of each differential pair are source coupled and in series with one adjustable current mirror supply. At least one of the plurality of differential pairs is configured to program a different gain of the output stage by varying a bias current of a corresponding adjustable current mirror supply. Further, the plurality of multi-gain transconductance amplifiers include a first stage multi-gain transconductance amplifier having a single non-inverting input, a single inverting input coupled to the ground node, and at least three outputs. The plurality of multi-gain transconductance amplifiers also include a final stage multi-gain transconductance amplifier having a single non-inverting input, a single inverting input coupled to the ground node and at least two outputs. Further, the plurality of multi-gain transconductance amplifiers include at least one intermediate stage multi-gain transconductance amplifier disposed in the cascade between the first multi-gain transconductance amplifier and the last multi-gain transconductance amplifier having at least one input, and at least three outputs, a first output of the at least three outputs establishing a feedback connection to the non-inverting input of the first multi-gain transconductance amplifier, a second output of the at least three outputs feeding in an output-to-input manner through the cascade, a third output of the at least three outputs establishing a feedforward connection to form an accumulative feedforward signal, a second output of the at least two outputs of the last multi-gain transconductance amplifier of the cascade connected to the feedforward connection adding to the accumulative feedforward signal.

In an embodiment, the multiple-gain transconductance amplifier in the reconfigurable high-order integrated circuit filter further includes a voltage-to-current conversion circuit that comprises a differential input voltage source and a first differential pair. The first differential pair further includes a third transistor and a fourth transistor, where gates of the third transistor and the fourth transistor are respectively connected to the differential input voltage source, drains of the third transistor and the fourth transistor are connected to a current mirror supply, and respective sources of the third transistor and the fourth transistor are connected to a diode-connected load. Further, one of the drains outputs the first single-ended current signal. The voltage-to-current conversion circuit also includes a second differential pair that includes a fifth transistor and a sixth transistor, where sources of the second differential pair are connected to and biased by a variable voltage source, gates of the second differential pair are connected to respective sources of the first differential pair, and respective drains of the second differential pair are cross-coupled to the drains of the first differential pair.

In an embodiment, programmable currents of the output stages of each multiple-gain transconductance amplifier in the reconfigurable high-order integrated circuit filter are set based on a first bias current of a first differential pair of the multiple-gain current-folding output stage, a second bias current of a second differential pair of the multiple-gain current-folding output stage, the transconductance of the input stage, a positive input voltage, and a negative input voltage.

In an embodiment, the reconfigurable high-order integrated circuit filter is configured to achieve independent programmability by using source-coupling differential pair topology with multiple-gain transconductance amplifier outputs.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or 5%, and any values in between.

The following is an assessment of publications and is intended not only as a review of related approach, but also on the inventor's recognition of attributes and limitation of these approaches, which set a baseline for the novel embodiments described herein.

Figure 1A:
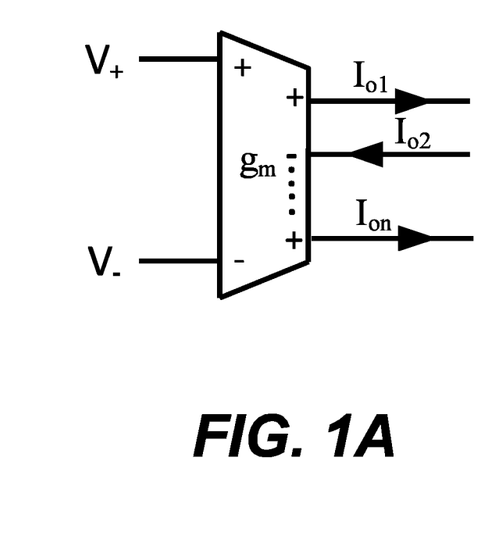
FIG. 1A shows an exemplary multi-output transconductance amplifier.

In an example, realizations of transconductance amplifier are available with single output and multi-outputs structures. In an example, the additional outputs are equal in magnitude but may be different in signs as shown in FIG. 1A. For example, the outputs can have same transconductance gain.

Figure 1B:
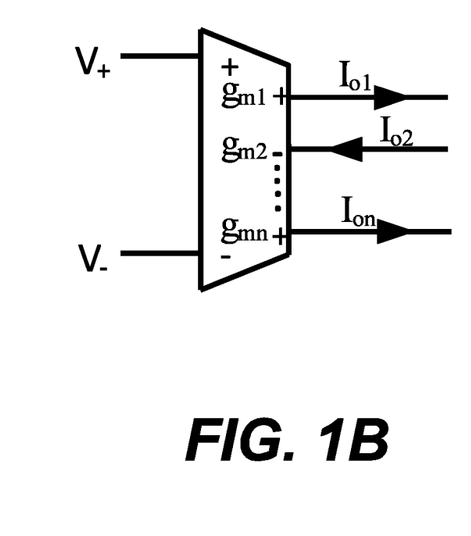
FIG. 1B shows an exemplary multi-gain transconductance amplifier.

Note that the proposed multi-gain transconductance amplifier can have a different gain for each output current, such as $g_{m1}$, $g_{m2}$, and $g_{mn}$ shown in FIG. 1B.

A multi-output transconductance amplifier is often converted to a multi-gain transconductance amplifier counterpart through replacing normal output stage current mirrors with tunable current mirrors. Examples include Pankiewicz, B., Wojcikowski, M., Szczepanski, S., and Sun, Y. (A field programmable analog array for CMOS continuous time OTA-C filter applications. IEEE J. Solid-State Circuits, 37(2), 125-136, (February 2002)—incorporated herein by reference) and Ramirez-Angulo, J., and Sanchez-Sinencio, E., (Current-mode continuous-time filters: Two design approaches. IEEE Trans. Cir. Syst. II. 39(6), 337-341, (June 1992)—incorporated herein by reference). The digitally tunable current mirror cells proposed in Pankiewicz, B., Wojcikowski, M., Szczepanski, S., and Sun, Y., (A field programmable analog array for CMOS continuous time OTA-C filter applications, IEEE J. Solid-State Circuits, 37(2), 125-136, (February 2002)—incorporated herein by reference) are power as well as area inefficient as the number of cell increases by 2 for each bit of tuning. For example, the first bit uses 2 output stages, $2^{nd}$ bit uses 4 output stages, $3^{rd}$ bit uses 8 output stages and so on. Therefore, the $6^{th}$ bit uses 64 output stages. Whereas the analog programmability used in Ramirez-Angulo, J., and Sanchez-Sinencio, E., Current-mode continuous-time filters: Two design approaches. IEEE Trans. Cir. Syst. II. 39(6), 337-341, (June 1992)—incorporated herein by reference) suffers from limited linearity. Also, that technique is power inefficient because the core transconductance amplifiers is used to employ several current mirrors for providing multi-output currents then each individual output can be applied to a separate programmable current mirror cell.

Figure 2:
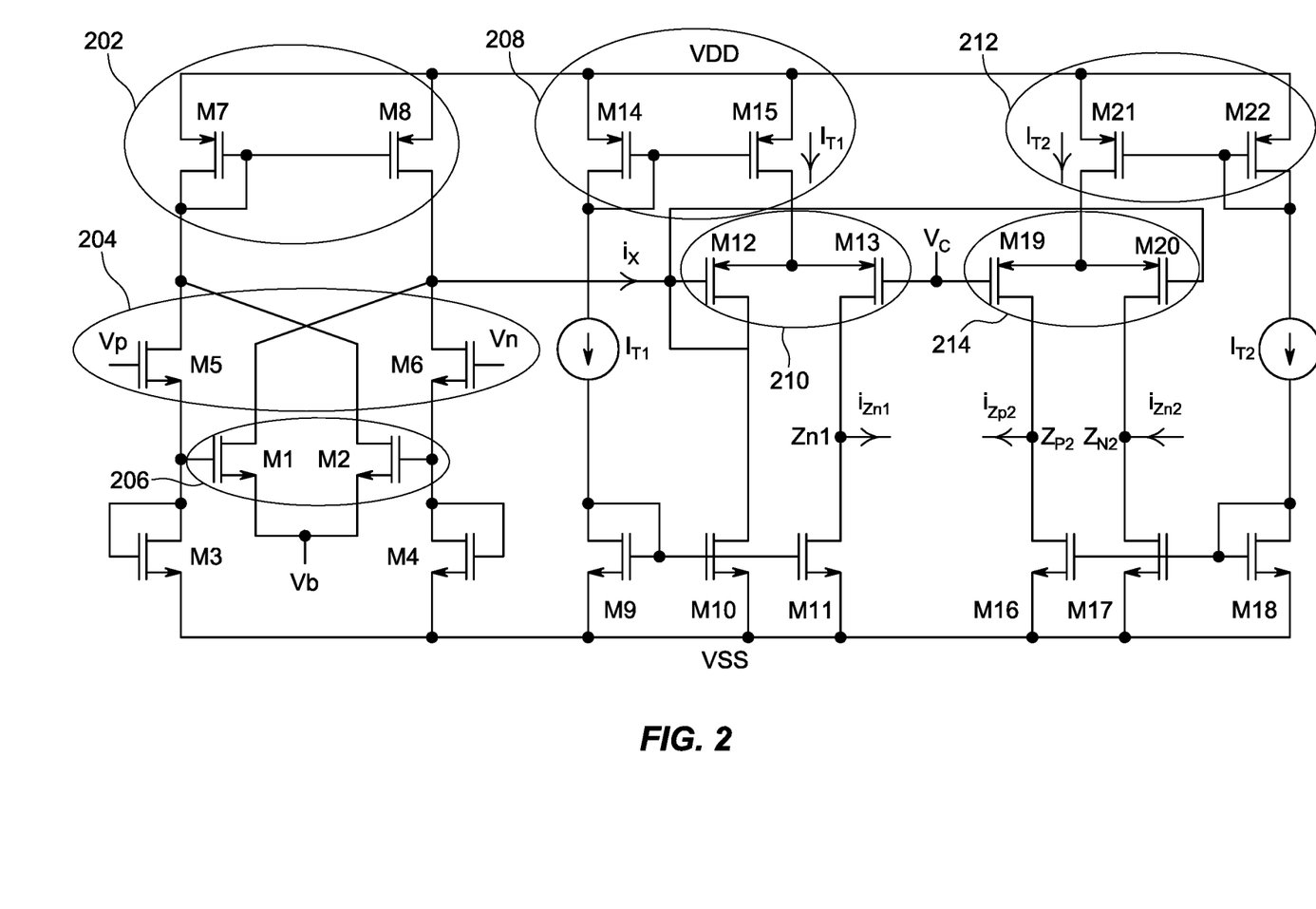
FIG. 2 is an exemplary circuit schematic of a disclosed multi-gain independently programmable transconductance amplifier.

FIG. 2 shows an exemplary embodiment of a disclosed multi-gain independently programmable transconductance amplifier. In an embodiment, the input stage employs a linear transconductance amplifier circuit whose output current is applied to current folding output stages. Multi-gain current folding output stages are utilized to obtain independently programmable transconductance amplifier outputs. The transistors M1-M8 (the core circuit M1-M6 was presented in S. C. Huang, M. Ismail, "Linear Tunable COMFET Transconductor", Electronics Letters, vol. 29, no. 5, pp. 459-461, March 1993—incorporated herein by reference), for example, are used to implement a linear tunable transconductor to convert differential input voltages into a single-ended tunable current $i_x$. Note that the proposed approach can be employed with any other transconductor. A current mirror circuit 202 is implemented by the transistors M7 and M8 to copy the current into M7 to M8, where transistor M7 is a diode connected transistor. A first differential pair 204 is implemented by the transistors M5-M6. A second differential pair 206 is implemented by the transistors M1-M2. The transistors M3 and M4 are diode connected transistor and function as load transistors. The transistors M1-M6 are matched transistors, thus, the transistors M1-M6 have the same length and width. Gates of the first differential pair are connected to a differential input voltage $V_p$ and $V_n$. The sources of M5 and M6 are connected to the drains of M3 and M4, respectively. The sources of M5 and M6 are further connected to the gates of M1 and M2, respectively. The drains of M5 and M6 are connected to the drains of the M7 and M8, respectively. The drains of M1 and M2 are cross-coupled, and connected to the drain of M6 and M5, respectively. The transistors M1 and M2 are source-coupled, and connected to a tunable voltage $V_b$.

The differential current of the transconductor is given by $$I_1 - I_2 = i_x = K_1(V_b - V_{ss})(V_p - V_n) \quad (1)$$

wherein $I_1$ is the current through the drains of the transistors M2 and M5, and $I_2$ is the current through the drains of the transistors M1 and M6, $K_1 = 0.5\mu_1 C_{ox1} W_1/L_1$ (for M1-M6) with $\mu_1$ as the surface carrier mobility, $C_{ox1}$ is the gate oxide capacitance per unit area, and $W_1$ and $L_1$ are the width and length of the channel for the matched transistors M1-M6. The voltage Vb is a DC biasing voltage, Vss is the negative supply voltage, Vp is the positive input voltage and Vn is the negative input voltage. The equation shows that the current $i_x$ and the differential input voltage have a linear relation. Therefore, the input stage transconductor amplifier has a linear transconductance ($g_m$) given by $g_m = K_1(V_b - V_{ss})$. $g_m$ is the linear transconductance and can be tuned by $V_b$.

The output stage is implemented by the transistors M9-M22. Another current mirror 208 is implemented by the transistors M14 and M15 to generate a current $I_{T1}$, wherein the transistor M14 is a diode connected transistor. The current mirror formed by M9-M11 is used to copy the current of M9 ($I_{T1}$) into M10 and M11, wherein the transistor M9 is a diode connected transistor.

A third different pair 210 is implemented by the transistors M12 and M13. The transistors M10-M11 functions as loads for the transistors M12 and M13. The current folding output stage is used to replace the normal current mirroring output stage and hence achieves robust linearity. The linear current $i_x$, which is generated by the input stage transconductor, is conveyed to the output port $Z_{n1}$ by source coupling M12 and M13. Since this coupled pair is biased with a constant tail current $I_{T1}$, the drain current changes in M12 and M13 would be equal but with opposite signs, resulting in a negative type current amplifier with unity gain.

Another pair differential pair 214 that consists of M19-M20 is connected parallel with M12-M13 to provide two additional current outputs. Another current mirror 212 is implemented by the transistors M21 and M22 to generate a current $I_{T2}$, wherein the transistor M22 is a diode connected transistor. The transistors M16-M17, forming a current mirror, are used to copy the current of M18 ($I_{T2}$) into M16 and M17, wherein the transistor M18 is a diode connected transistor. When the differential pair including M19 and M20 is biased with the different tail current $I_{T2}$, the large signal current relationship of the output stage is given by:

$$i_{Zp2} = i_{Zn2} = \sqrt{\frac{I_{T2}}{I_{T1}}} \frac{\sqrt{1 - \left(\frac{K_2 V_d^2}{4I_{T2}}\right)}}{\sqrt{1 - \left(\frac{K_2 V_d^2}{4I_{T1}}\right)}} i_x \quad (2)$$

where $I_{T1}$ is a first bias current of the differential pair 208 of the multiple-gain current-folding output stage, $I_{T2}$ is a second bias current of the differential pair 212 of the multiple-gain current-folding output stage, $V_d = V_c - V_{g12}$ (i.e. the differential voltage of the two source coupled pairs 210), $V_c$ is a bias DC voltage for the transistors M13 and M19, $V_{g12}$ is a gate voltage of the transistor M12, $K_2 = 0.5\mu_2 C_{ox2} W_2/L_2$ for the matched transistor pairs M12-M13 and M19-M20 with $\mu_2$ as the surface carrier mobility, $C_{ox2}$ is the gate oxide capacitance per unit area, and $W_2$ and $L_2$ are the width and length of the channel. Thus, for small signals $V_d \ll 2[\min.(I_{T1}, I_{T2})/K_2]^{1/2}$, the relationship simplifies to:

$$i_{Zp2} = i_{Zn2} = (I_{T2}/I_{T1})^{1/2} i_x \quad (3)$$

This would result in the overall programmable gains of:

$$i_{Zp2} = i_{Zn2} = \left(\frac{I_{T2}}{I_{T1}}\right)^{\frac{1}{2}} g_m (V_p - V_n) \quad (4)$$

wherein $g_m$ is the transconductance of the linear transconductor forming the input stage given before by $g_m = K_1(V_b - V_{ss})$.

Thus, tail currents, such as $I_{T1}$ and $I_{T2}$, can be adjusted to program the gain of new outputs. Extra output currents with different gains are obtained by adding more output stages with each stage providing both positive and negative signals. As will be seen below, the original output current $i_{Zn1} = i_x = g_m V_d$ can be utilized to realize output with gain $g_r$'s while the new outputs can be used to provide independent gains of FIG. 8.

Figure 3:
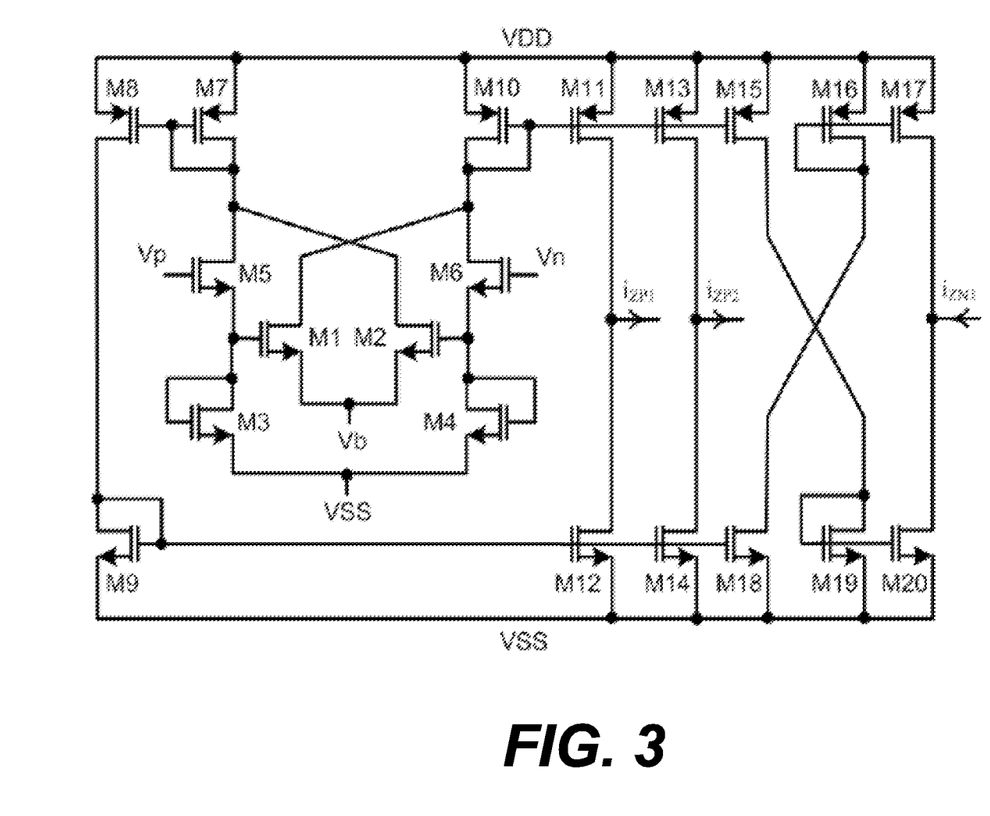
FIG. 3 is an exemplary circuit schematic of a multi-outputs transconductance amplifiers with dependent gains.

Another advantage of adopting the proposed output stages is that the input stage transconductance amplifiers can be used to provide an output. In such a case a single current mirror i.e. M7-M8 is sufficient to generate the linearized output current ($i_x$), as shown in FIG. 2. On the other hand, several current mirrors can be used to realize the first output current. Consequently, several other current mirrors would be needed to generate copies of this output current. In order to demonstrate this point, a three-output transconductance amplifier whose core circuit (M1-M6) obtained from one reference, S. C. Huang, M. Ismail, "Linear Tunable COMFET Transconductor", Electronics Letters, vol. 29, no. 5, pp. 459-461, March 1993.—incorporated herein by reference) is showed in FIG. 3. FIG. 3 is a multi-output transconductance amplifier with dependent gains. It includes an input stage that employs linear transconductance amplifiers circuit whose output current is applied to the normal current mirror output stages. Three current mirrors (M7-M8, M9-M12, and M10-M11) are used to generate the first output current ($i_{ZP1}$). Also, more output current copies are obtained by employing additional normal (M13-M14) and/or cross coupled (M15 through M20) current mirrors. The transistors M15-M20 are used to invert the direction of the output current. Hence, a total number of transistors for the proposed design of FIG. 2 is twenty-two, while a total number of transistors for the design in FIG. 3 is twenty. Therefore, the disclosed design achieved a programmability feature at the cost of just two additional transistors unlike the other available solutions.

Figure 4:
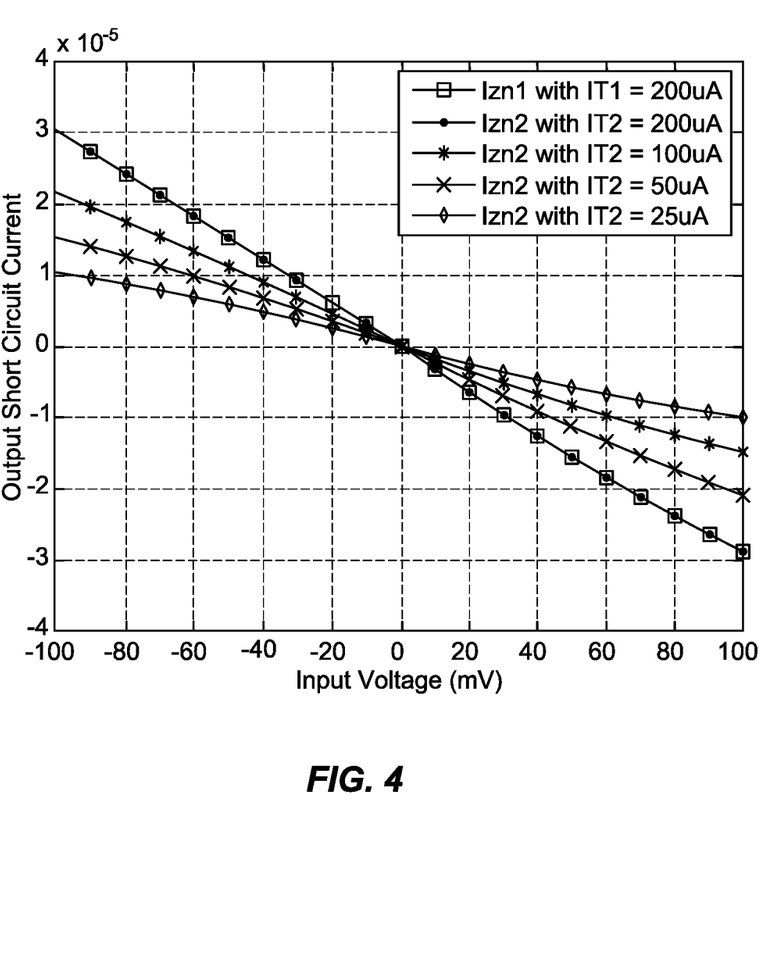
FIG. 4 shows DC responses of the disclosed multi-gain independently programmable transconductance amplifier with independent gain tunings.

In an example, the proposed transconductance amplifiers was simulated and optimized for 0.18 μm CMOS technology using supply voltages of ±0.9V. The independent tuning capability of the circuit shown in FIG. 2 is demonstrated in FIG. 4 by plotting the DC response for output currents $I_{Zn1}$ and $I_{Zn2}$ for several values of $I_{T1}$ and $I_{T2}$. FIG. 4 shows the exemplary DC responses of the disclosed multi-gain independently programmable transconductance amplifier with independent gain tunings. For example, it can be seen that when $I_{T1}$ and $I_{T2}$ are equal the output currents $I_{zn1}$ and $I_{zn2}$ are equal as well. When $I_{T2}$ is decreased by a factor of 4, the output current $I_{zn2}$ decreases by a factor of 2.

Figure 5:
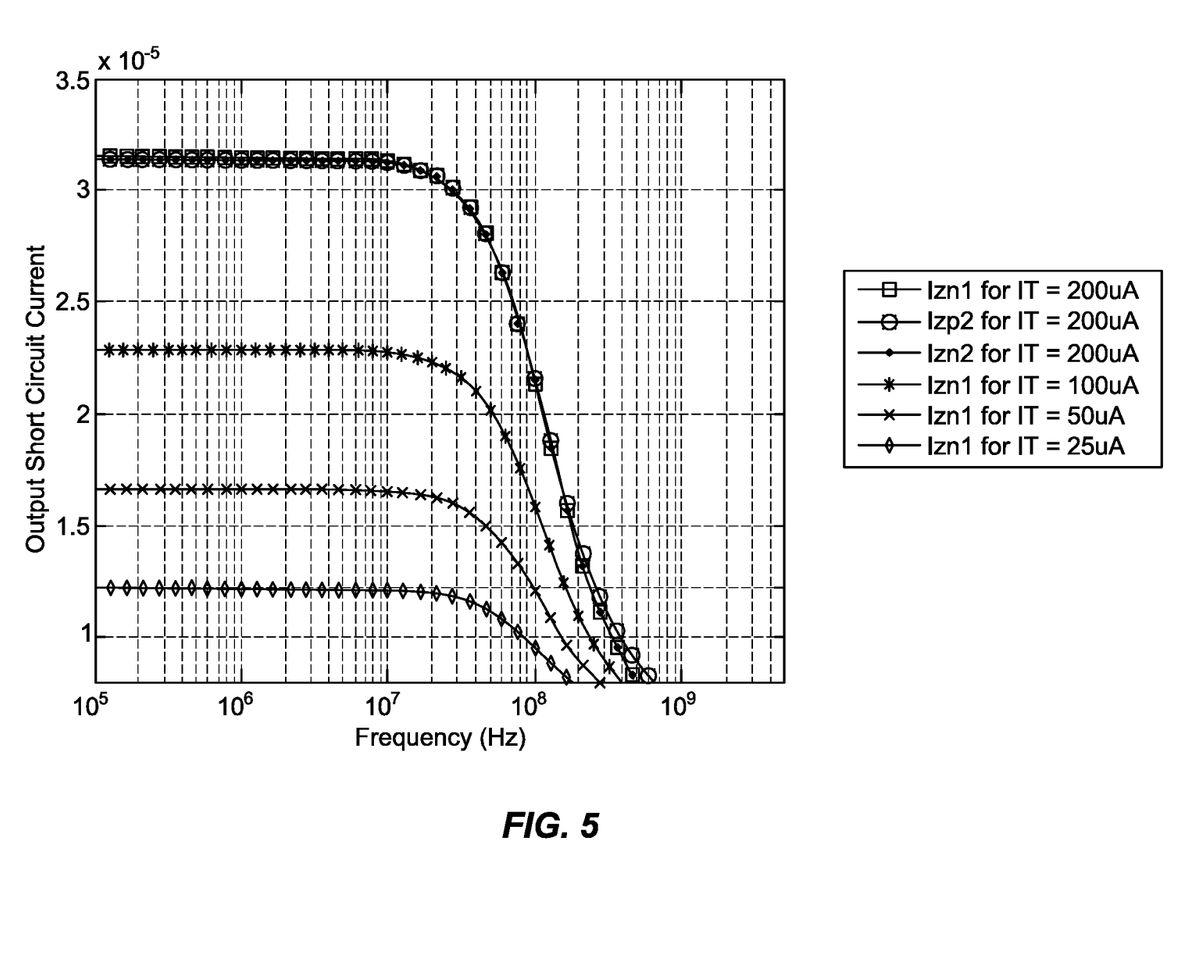
FIG. 5 shows AC responses of the disclosed multi-gain independently programmable transconductance amplifier with independent tunings.

FIG. 5 shows exemplary AC responses of the disclosed multi-gain independently programmable transconductance amplifier with independent tunings. It can be seen that the −3 dB bandwidth remains constant and above 100 MHz for various gain settings of the tail currents of $I_{T1}$ and $I_{T2}$.

Figure 6:
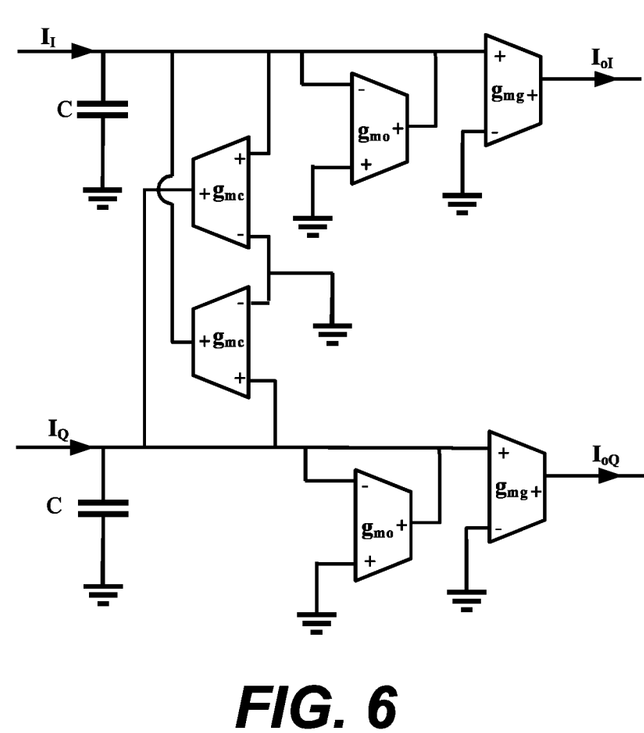
FIG. 6 shows a current-mode poly-phase filter according to an aspect of the disclosure.

In order to demonstrate the advantages of the proposed multi-gain $g_m$, two examples are given. FIG. 6 shows a current-mode polyphase filter based on single ended $g_m$.

It can be shown that the filter exhibits the following transfer functions.

$$\frac{I_{ol}}{I_l} = \frac{I_{oQ}}{I_Q} = \frac{\frac{g_{mg}}{C}}{s - j\frac{g_{mc}}{C} + \frac{g_{mo}}{C}} \quad (5)$$

Figure 7:
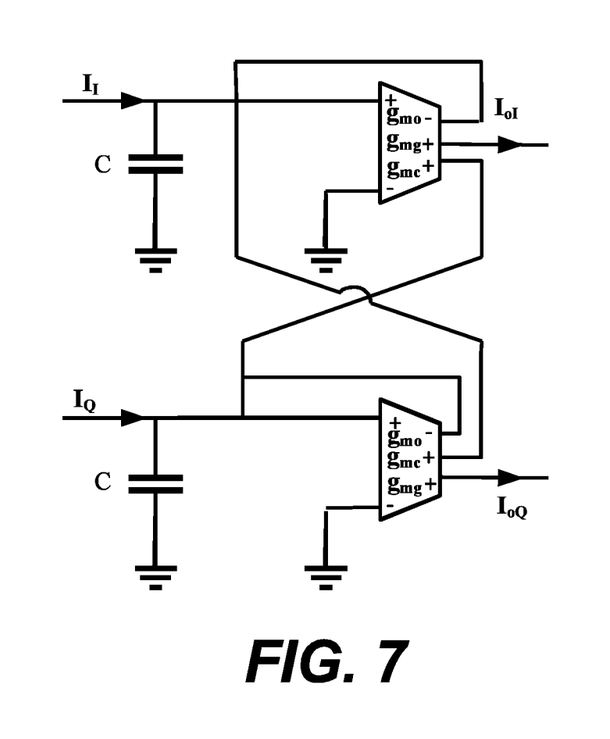
FIG. 7 shows a poly-phase filter according to an aspect of the disclosure.

The corresponding filter based on the proposed multi-gain $g_m$ is shown in FIG. 7. Although the filter uses two gm's, the filter has the same transfer functions given by Eq.(5). The filters center frequency, pole frequency, and gain are given by $g_{mc}/C$, $g_{mo}/C$, and $g_{mg}/g_{mo}$, respectively.

It is clear that if the filter of FIG. 7 was realized with traditional multi-output $g_m$'s then $g_{mc}$, $g_{mg}$, and $g_{mo}$ would be equal. Thus, programmability features would be lost as the filter would have undesired features of a unity gain and equal pole and center frequencies.

The second example focuses on the realization of a reconfigurable nth-order filter (RNOF). A RNOF is a versatile filter that can be flexibly used to realize any nth-order filter function without hardware changes and, hence, serves wide range of applications. Such filters are core parts of systems utilizing field reconfigurable analog arrays (FRAAs), which are described in references such as Pankiewicz, B., Wojcikowski, M., Szczepanski, S., and Sun, Y., (A field programmable analog array for CMOS continuous time OTA-C filter applications. IEEE J. Solid-State Circuits, 37(2), 125-136, (February 2002)—incorporated herein by reference).

Power consumption and independent programmability are two main criteria for FRAAs. Therefore, RNOF are expected to both adopt a minimum number of active devices and maintain independent programmability characteristics. RNOFs can be operated at different frequencies, (e.g. accommodating different bandwidths), change the filter type (e.g. low-pass to band-pass), and modify the overall response (e.g. Butterworth to Chebyshev) According to this disclosure, the disclosed programmable multi-gains transconductance amplifier can be efficient in the number of active devices used as well as maintain independent tuning characteristics.

Multi-outputs transconductance amplifiers are usually used to reduce the number of active devices. In some examples, one or more tuning feature is lost. For example, the filter in Sun, Y., and Fidler, K., (Current-mode OTA-C realization of arbitrary filters characteristics. Electron. Lett. 32(13), 1181-1182 (June 1996)—incorporated herein by reference) uses n+2 single-output transconductance amplifiers plus n dual-outputs transconductance amplifiers while FIG. 3 adopts n+3 single output transconductance amplifiers plus n dual-outputs transconductance amplifiers. But both filters have dependent coefficients. The filter in Chang, C., Al-Hashimi, B. M., Sun, Y., and Ross, J. N, (New high-order filter structures using only single-ended-input OTAs and grounded capacitors. IEEE Trans. Cir. Syst. I. 51(9), 458-463, (September 2004)—incorporated herein by reference) employs n+2 single-output transconductance amplifiers plus n+2 dual-outputs transconductance amplifiers but it exhibits dependent coefficients too. The filter suggested in Chang, C., Hou, C., Chung, W., Horng, J., and Tu, C.: Analytical synthesis of high-order single-ended-input OTA-grounded C all-pass and band-reject filter structures. IEEE Trans. Cir. Syst. I. 53(3), 489-498, (March 2006)—incorporated herein by reference) uses two transconductance amplifiers with n outputs but also it exhibits transfer functions with dependent coefficients as well. Similarly, the filter in Feng, J., Wang, C., Zang, M., and Ren, Y., (Realization of current-mode general nth-order filter based on current mirrors. 3rd International Conference on Advanced Computer Control (ICACC 2011). 367-370, (2011)—incorporated herein by reference) incorporating n single output transconductance amplifiers plus one transconductance amplifiers with n+1 outputs exhibits dependent coefficients too. The filter in Tsukutani, T., (A general class of current-mode high-order OTA-C filters, International Journal of Electronics. 81(6), 663-669, (1996)—incorporated herein by reference) employs n−1 transconductance amplifiers with 3 outputs, two transconductance amplifiers with two outputs, and one single-output transconductance amplifiers. The work assumes the various output have different gains. However, the given simulations were based on a transconductance amplifiers macro model and the CMOS realization needed to provide independent programmability was not provided.

Figure 8:
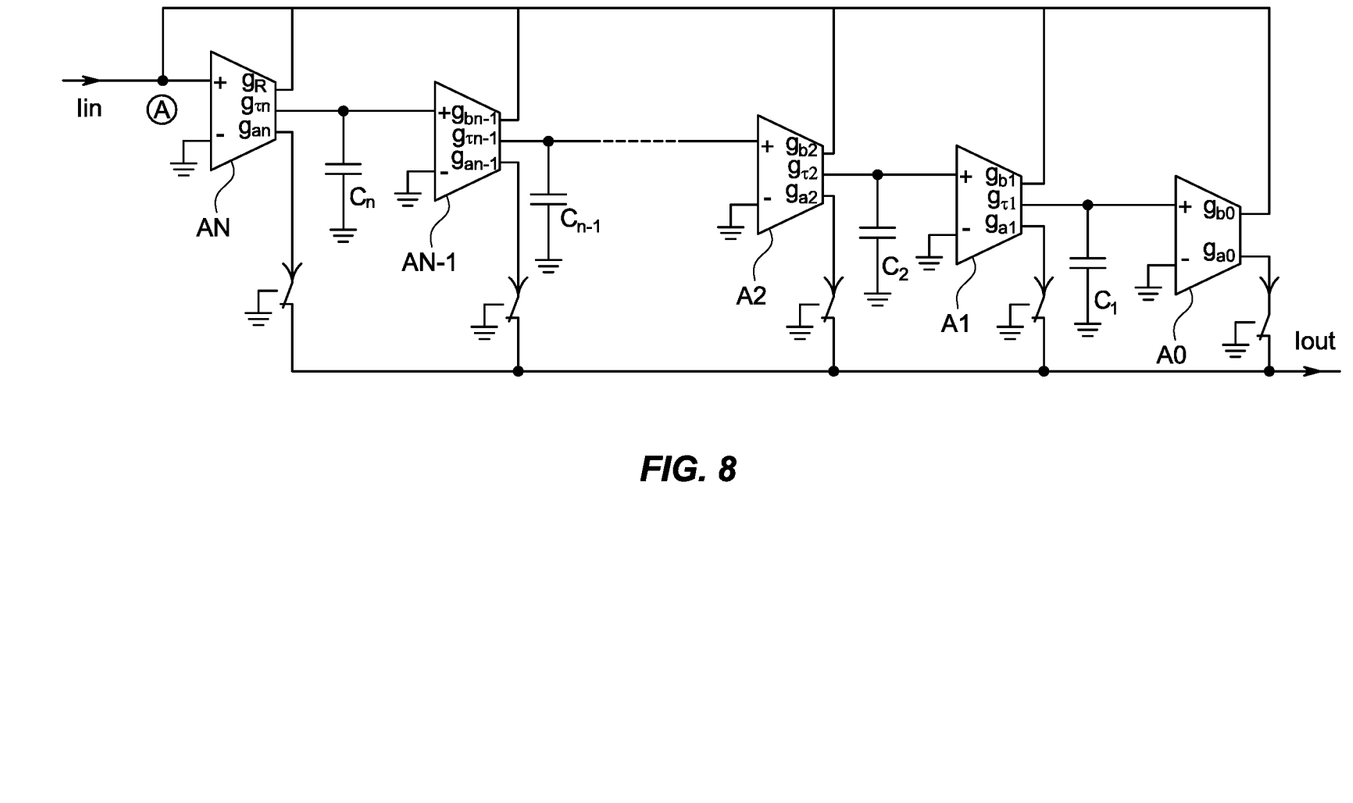
FIG. 8 is an embodiment of a filter topology based on multi-gain independently programmable transconductance amplifiers.

Therefore, the most efficient realization is the current-mode topology as it incorporates the minimum possible (n+1) transconductance amplifiers as shown in FIG. 8 (disclosed in U.S. Pat. No. 8,872,580, which is incorporated herein by reference in its entirety). This is achieved as a single transconductance amplifier can be utilized to efficiently develop the integrator such that the feedback factor and output signals can be realized using the same device. The filter of FIG. 8 is functionally similar, but structurally different to its counterpart filter in Tsukutani, T., (A general class of current-mode high-order OTA-C filters, International Journal of Electronics. 81(6), 663-669, (1996)—incorporated herein by reference) using one transconductor less. However, transconductance amplifiers having outputs with different gains would be used to promote independent programmability features. The transfer function of the filter of the FIG. 8 is given by equation (6):

$$T(s) = \frac{I_{out}}{I_{in}} = \frac{\frac{g_{a_n}c_1c_2\ldots c_n}{g_{\tau_1}g_{\tau_2}\cdots g_{\tau_n}}s^n + \frac{g_{a_{n-1}}c_1c_2\ldots c_{n-1}}{g_{\tau_1}g_{\tau_2}\cdots g_{\tau_{n-1}}}s^{n-1} + \ldots + \frac{g_{a_2}c_1c_2}{g_{\tau_1}g_{\tau_2}}s^2 + \frac{g_{a_1}c_1}{g_{\tau_1}}s + g_{a_o}}{\frac{g_Rc_1c_2\ldots c_n}{g_{\tau_1}g_{\tau_2}\cdots g_{\tau_n}}s^n + \frac{g_{b_{n-1}}c_1c_2\ldots c_{n-1}}{g_{\tau_1}g_{\tau_2}\cdots g_{\tau_{n-1}}}s^{n-1} + \ldots + \frac{g_{b_2}c_1c_2}{g_{\tau_1}g_{\tau_2}}s^2 + \frac{g_{b_1}c_1}{g_{\tau_1}}s + g_{b_o}} \quad (6)$$

where $s=j\omega$, $\omega$ is an operational frequency of the filter, n is an order of the filter.

In FIG. 8, n+1 multi-gain transconductance amplifiers are arranged in cascade to generate a reconfigurable nth-order filter with independent programmability. A first stage multi-gain transconductance amplifier AN includes a single non-inverting input, a single inverting input coupled to the ground node and three transconductance amplifiers outputs. N−1 intermediate stage multi-gain transconductance amplifiers (from AN−1 to A1) are disposed in the cascade between the first multi-gain transconductance amplifier and the last multi-gain transconductance amplifier A0. Each of the multi-gain transconductance amplifiers (from AN−1 to A1) includes a single non-inverting input, one inverting input, and at least three outputs. A first output of each of the multi-gain transconductance amplifiers (AN−1 to A1) feedbacks to the non-inverting input of the multi-gain transconductance amplifier AN. A second output of each of multi-gain transconductance amplifiers (AN−1 to A1) feeds to the non-inverting input of the next cascade multi-gain transconductance amplifiers (AN−2 to A0). A third output of each of the multi-gain transconductance amplifiers (AN−1 to A1) establishes a feedforward connection with the third outputs of all the other multi-gain transconductance amplifiers (AN−1 to A1) to form an accumulative feedforward signal. A final stage multi-gain transconductance amplifier A0 includes a single non-inverting input, a single inverting input coupled to the ground node and two outputs. A first output of the final stage transconductance amplifier A0 feedbacks to the non-inverting input of the first stage transconductance amplifier AN. A second output of the final stage transconductance amplifier A0 connects with the third outputs of all the other multi-gain transconductance amplifiers (AN to A1). The filter includes N capacitors (Cn to C1). Each capacitor (Cn−1 to C1) is connected between the ground node and the second output of the intermediate stage (AN−1 to A1). Cn is connected between the ground node and the second output of the final stage (AN).

Combining the transconductance amplifiers circuit of FIG. 2 and the filter structure of FIG. 8 would lead to a RNOF employing n+1 transconductance amplifiers while preserving independent filter coefficients. This filter uses less number of active devices compared to the solutions based on current amplifier (CA) and voltage follower (VF) in references, such as Alzaher, H., Tasadduq, N., and Al-Ees, O., (Digitally programmable high-order current-mode universal filters. Analog Int. Circ. and Signal Processing, 67(2), 179-187, (2010),—incorporated herein by reference) and Alzaher, H., Tasadduq, N., and Al-Ees, O., (A class of digitally programmable nth-order filters. Int. J. Circ. Theor. Appl. 40(9), 943-956, (September 2012)—incorporated herein by reference) as well as its counterpart based on a second generation current conveyors (CCII) described in Mahmoud, S. A.: Digitally programmable second generation current conveyor-based FPAA. Int. J. Circ. Theor. Appl. Int. J. Circ. Theor. Appl., 41(10), 1074-1084,—incorporated herein by reference) and Alzaher, H., Tasadduq, N. and Al-Ees, O., (Implementation of reconfigurable nth-order filter based on CCII. Analog Integrated Circuits and Signal Processing, 75(3), 539-545,—incorporated herein by reference). This is because that the filters of Alzaher, H., Tasadduq, N., and Al-Ees, O., (Digitally programmable high-order current-mode universal filters. Analog Int. Circ. and Signal Processing, 67(2), 179-187, (2010),—incorporated herein by reference) and Alzaher, H., Tasadduq, N., and Al-Ees, O., (A class of digitally programmable nth-order filters. Int. J. Circ. Theor. Appl. 40(9), 943-956, (September 2012)—incorporated herein by reference) use n+3 CAs plus n VFs and n+2 CA plus n+1 VFs, respectively. Whereas the filter of Mahmoud, S. A.: Digitally programmable second generation current conveyor-based FPAA. Int. J. Circ. Theor. Appl. Int. J. Circ. Theor. Appl., 41(10), 1074-1084— incorporated herein by reference), employs 3n+3 digitally controlled CCIIs and that of Alzaher, H., Tasadduq, N., and Al-Ees, O., (A class of digitally programmable nth-order filters. Int. J. Circ. Theor. Appl. 40(9), 943-956, (September 2012)—incorporated herein by reference) uses n+2 CCII plus 2n+1 CAs.

In an example, certain second-order filters are not suitable for implementing RNOF although they can be connected in cascade to achieve high-order functions. They cannot implement odd-order responses. In addition, biquads based on single active devices do not promote electronics tuning. On the other hand, it can be shown that universal biquads adopting multi-active devices are inefficient when employed to achieve high-order functions. For example, the filter in (New Configuration for OFCC-Based CM SIMO Filter and its Application as Shadow Filter, Arabian Journal for Science and Engineering, 2018, vol. 59.—incorporated herein by reference) can use six and nine active devices to realize $4^{th}$ and $6^{th}$-order functions while the proposed solution of FIG. 9 uses five and seven, respectively.

The $g_m$ can be incorporated in the design of an amplifier (AMP)-based low-dropout regulator (LDO). The AMP-based LDO is attractive due to its more accurate line/load regulation resulted from its high dc gain. The AMP-based LDO can include the main LDO and a $g_m$-cell. The auxiliary path formed by the $g_m$-cell is added in parallel to compensate for low frequency LDO output pole. It is important that the effective transconductance of the $g_m$-cell to be high in order to generate feed-forward zero inside loop gain bandwidth (GBW).

In an example, a $4^{th}$-order 7 MHz cutoff frequency Butterworth filter obtained from FIG. 8 was fabricated in a 0.18 μm CMOS process, using capacitors values of $C_1$=16.7 pF, $C_2$=8.3 pF, $C_3$=4.9 pF, and $C_4$=2.4 pF.

Figure 9:
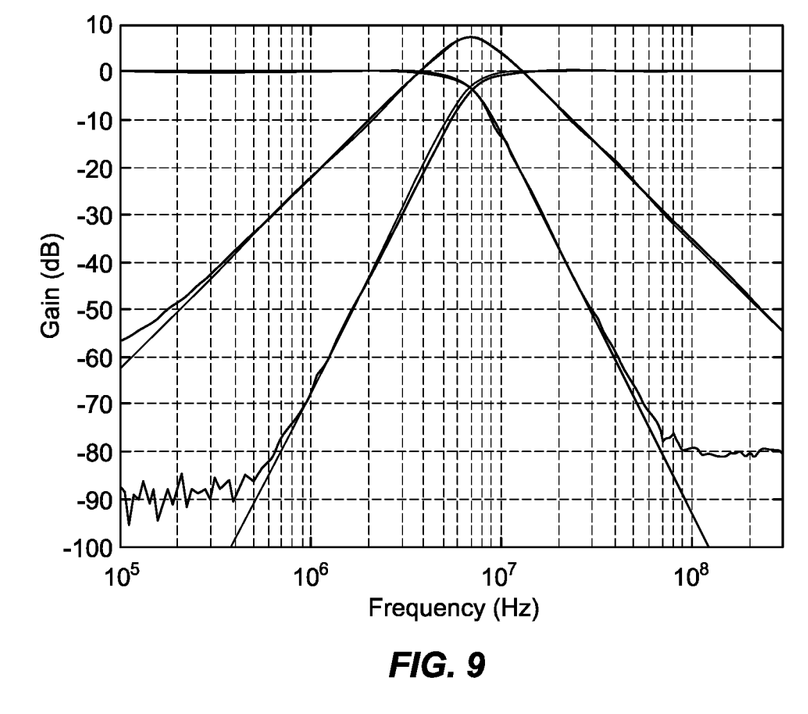
FIG. 9 shows low-pass, high-pass and band-pass responses of the fourth-order filter.
Figure 10:
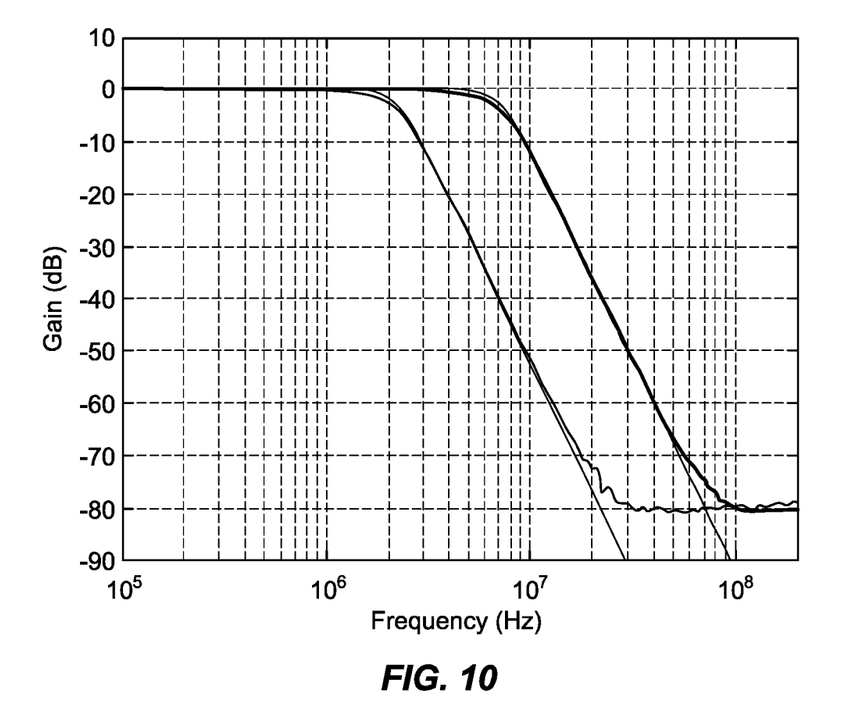
FIG. 10 shows Butterworth low-pass responses of the fourth-order filter demonstrating programmable pole frequency.
Figure 11:
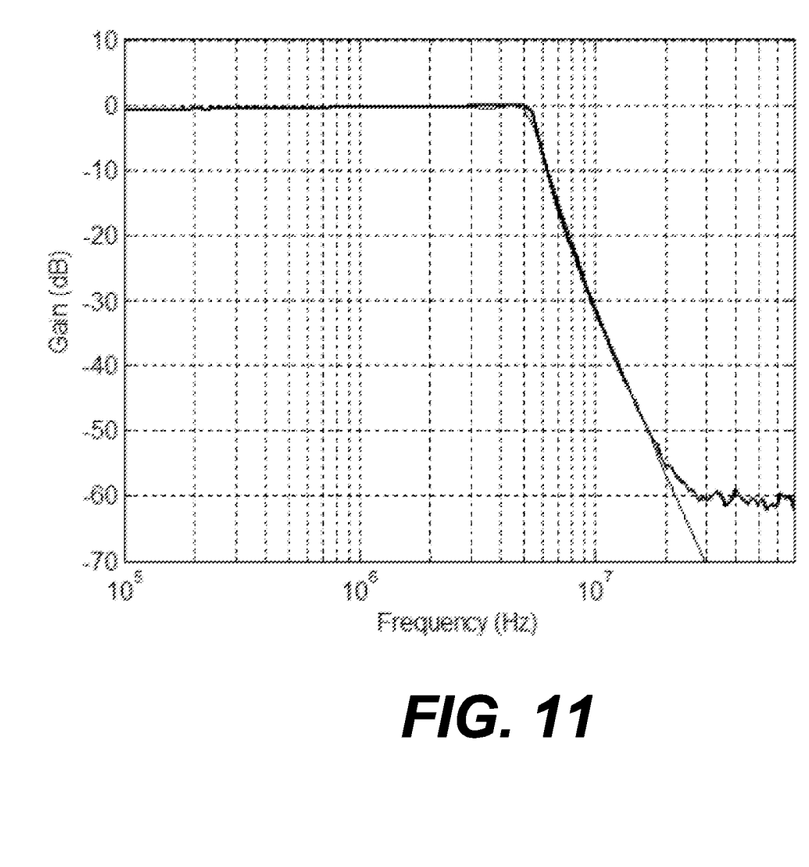
FIG. 11 shows Chebyshev low-pass responses of the fourth-order filter.

In an embodiment, a biasing current of each transconductance amplifier is about 1 mA, however, less than 10% of it is used for operating the programmable output stages. The experimental results for the low-pass, bandpass and high-pass outputs are shown in FIG. 9. Operating frequencies of the filter can be tuned by simultaneously changing all the forward path parameters, $g_{\tau 1}$ to $g_{\tau 4}$. The experimental results showing the tuning feature for a $4^{th}$ order Butterworth low-pass filter is shown in FIG. 10. When the controlling currents are simultaneously changed from 10 μA to 100 μA giving the tuning of cutoff frequency from 2.2 MHz to 7 MHz. The $4^{th}$ order Butterworth low-pass filter coefficients can be changed to realize a Chebyshev $4^{th}$ order low-pass filter for 5 MHz cutoff frequency. The experimental results are shown in FIG. 11.

As recognized by the inventor, the canonic filters reported in the literature are not suitable for reconfigurable applications, not only for the lack of programmability features, but also for the demand of matching conditions to realize the high-pass response. On the other hand, universal filter structures are associated with independent filter characteristics but employ more transconductance amplifiers. Adopting multi-outputs transconductance amplifiers leads to optimum solution having minimum number of devices. However, the adopted multi-outputs transconductance amplifiers are associated with different gains in order to maintain independent programmability characteristics. Consequently, a new CMOS programmable multi-gain transconductance amplifier has been developed. The proposed transconductor amplifier employs a transconductance amplifiers circuit at its input stage and current folding output stages whose gains can be controlled via their respective biasing currents. Experimental results obtained from a $4^{th}$-order universal filter demonstrating versatile programmability features are provided and show the independent gain tuning capability by varying the biasing current of the current folding output stages.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

The invention claimed is:

1. A multiple-gain independently programmable transconductance amplifier, comprising:
a voltage-to-current conversion circuit configured to receive a differential input voltage signal at a first input and provide at an output node a first single-ended current signal that is linearly proportional to the differential input voltage signal; and
a multiple-gain current-folding output stage comprising a plurality of differential pairs, wherein each differential pair includes a first transistor and a second transistor, a first gate of the first transistor being directly connected to the output node, and a second gate of the second transistor being directly connected to a bias voltage source, the first transistor and the second transistor of each differential pair being source coupled and in series with one adjustable current mirror supply, at least one of the plurality of differential pairs is configured to program a different gain of the output stage by varying a bias current of a corresponding adjustable current mirror supply.

2. The multiple-gain independently programmable transconductance amplifier of claim 1, wherein the voltage-to-current conversion circuit further comprises:
a differential input voltage source;
a first differential pair that includes a third transistor and a fourth transistor, gates of the third transistor and the fourth transistor respectively connected to the differential input voltage source, sources of the third transistor and the fourth transistor being connected to a current mirror supply, respective drains of the third transistor and the fourth transistor being connected to a diode-connected load, wherein one of the drains outputs the first single-ended current signal; and
a second differential pair that includes a fifth transistor and a sixth transistor, sources of the second differential pair being connected to and biased by a variable voltage source, gates of the second differential pair being connected to respective sources of the first differential pair, and respective drains of the second differential pair being cross-coupled to the drains of the first differential pair.

3. The multiple-gain independently programmable transconductance amplifier of claim 2, wherein programmable currents of the output stages of the multiple-gain independently programmable transconductance amplifier are set based on a first bias current of a first differential pair of the multiple-gain current-folding output stage, a second bias current of a second differential pair of the multiple-gain current-folding output stage, a transconductance of the input stage, a positive input voltage, and a negative input voltage.

4. A reconfigurable high-order integrated circuit filter, comprising:
a ground node;
a plurality of multi-gain transconductance amplifiers wherein each multi-gain transconductance amplifier having
a voltage-to-current conversion circuit configured to receive a differential input voltage signal at a first input and provide at an output node a first single-ended current signal that is linearly proportional to the differential input voltage signal; and
a multiple-gain current-folding output stage comprising a plurality of differential pairs, wherein each differential pair includes a first transistor and a second transistor, a first gate of the first transistor being directly connected to the output node, and a second gate of the second transistor being directly connected to a bias voltage source, the first transistor and the second transistor of each differential pair being source coupled and in series with one adjustable current mirror supply, at least one of the plurality of differential pairs is configured to program a different gain of the output stage by varying a bias current of a corresponding adjustable current mirror supply, and the plurality of multi-gain transconductance amplifiers including,
a first stage multi-gain transconductance amplifier having a single non-inverting input, a single inverting input coupled to the ground node, and at least three outputs;
a final stage multi-gain transconductance amplifier having a single non-inverting input, a single inverting input coupled to the ground node and at least two outputs; and
at least one intermediate stage multi-gain transconductance amplifier disposed in the cascade between the first multi-gain transconductance amplifier and the last multi-gain transconductance amplifier having at least one input, and at least three outputs, a first output of the at least three outputs establishing a feedback connection to the non-inverting input of the first multi-gain transconductance amplifier, a second output of the at least three outputs feeding in an output-to-input manner through the cascade, a third output of the at least three outputs establishing a feedforward connection to form an accumulative feedforward signal, a second output of the at least two outputs of the last multi-gain transconductance amplifier of the cascade connected to the feedforward connection adding to the accumulative feedforward signal; and a plurality of capacitors, each capacitor connected between the ground node and a second of the at least three outputs of the intermediate stage multi-gain transconductance amplifier.

5. The reconfigurable high-order integrated circuit filter of claim 4, wherein the voltage-to-current conversion circuit of the multi-gain transconductance amplifier further comprises:

a differential input voltage source;

a first differential pair that includes a third transistor and a fourth transistor, gates of the third transistor and the fourth transistor respectively connected to the differential input voltage source, sources of the third transistor and the fourth transistor being connected to a current mirror supply, respective drains of the third transistor and the fourth transistor being connected to a diode-connected load, wherein one of the drains outputs the first single-ended current signal; and a second differential pair that includes a fifth transistor and a sixth transistor, sources of the second differential pair being connected to and biased by a variable voltage source, gates of the second differential pair being connected to respective sources of the first differential pair, and respective drains of the second differential pair being cross-coupled to the drains of the first differential pair.

6. The reconfigurable high-order integrated circuit filter of claim 5, wherein programmable currents of the output stages of each multiple-gain transconductance amplifier are set based on a first bias current of a first differential pair of the multiple-gain current-folding output stage, a second bias current of a second differential pair of the multiple-gain current-folding output stage, the transconductance of the input stage, a positive input voltage, and a negative input voltage.

7. The reconfigurable high-order integrated circuit filter of claim 6, wherein the filter is configured to achieve independent programmability by using source-coupling differential pair topology with multiple-gain transconductance amplifier outputs.

* * * * *